(12) United States Patent
Akamatsu et al.

(10) Patent No.: US 7,080,987 B2
(45) Date of Patent: Jul. 25, 2006

(54) APPARATUS FOR CONNECTING ELECTRONIC UNITS TOGETHER

(75) Inventors: Shinya Akamatsu, Tokyo (JP); Masahiro Yamada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/784,942

(22) Filed: Feb. 25, 2004

(65) Prior Publication Data

US 2004/0192077 A1 Sep. 30, 2004

(30) Foreign Application Priority Data

Mar. 24, 2003 (JP) ............................. 2003-080096

(51) Int. Cl.
*H01R 12/00* (2006.01)
(52) U.S. Cl. .................. 439/61; 361/796; 361/802; 439/64; 439/267
(58) Field of Classification Search ............... 439/61, 439/79, 905–906, 928.1, 945–947, 951, 64, 439/637, 260, 267, 327; 361/608, 684, 686, 361/719–720, 796–802
See application file for complete search history.

(56) References Cited

U.S. PATENT DOCUMENTS

| 3,328,646 | A | * | 6/1967 | Caillat | 361/796 |
|---|---|---|---|---|---|
| 3,576,515 | A | * | 4/1971 | Frantz | 439/267 |
| 3,810,433 | A | * | 5/1974 | Posner | 211/41.17 |
| 4,087,148 | A | * | 5/1978 | Bauerle | 439/260 |
| 4,158,220 | A | * | 6/1979 | Yamamoto et al. | 361/796 |
| 4,542,341 | A | * | 9/1985 | Santomango et al. | 324/760 |
| 4,587,596 | A | * | 5/1986 | Bunnell | 361/749 |
| 5,467,254 | A | * | 11/1995 | Brusati et al. | 361/799 |
| 6,115,242 | A | * | 9/2000 | Lambrecht | 361/684 |
| 6,128,196 | A | | 10/2000 | Hoyle, Jr. et al. | 370/389 |
| 6,253,266 | B1 | * | 6/2001 | Ohanian | 710/301 |
| 6,396,690 | B1 | * | 5/2002 | Blatti | 361/690 |
| 6,780,043 | B1 | * | 8/2004 | Malmberg | 439/377 |
| 6,851,953 | B1 | * | 2/2005 | Kamiyamane | 439/59 |
| 2003/0063454 | A1 | * | 4/2003 | Wilson et al. | 361/796 |

FOREIGN PATENT DOCUMENTS

JP    9-172240 A    6/1997
KR    2001-52256 A    6/2001

* cited by examiner

*Primary Examiner*—Michael C. Zarroli
(74) *Attorney, Agent, or Firm*—Sughrue Mion, PLLC

(57) ABSTRACT

An apparatus for making an electrical connection with an electrical unit which has an edge portion and terminals disposed along the edge portion. The apparatus includes a supporting member and a connector supported by the supporting member. The connector has a body elongated in a longitudinal direction and second terminals disposed along the longitudinal direction. The connector slidably guides the edge portion of the electrical unit along the longitudinal direction to a first fully inserted position such that each one of the terminals of the connector faces respective one of the terminals of the electrical unit.

39 Claims, 9 Drawing Sheets

APPARATUS FOR CONNECTING ELECTRONIC UNITS TOGETHER

BACKGROUND OF THE INVENTION

1. Field of the Invention

The present invention relates to an apparatus for electrically connecting electronic units together, and in particular, to an apparatus for electrically connecting electronic units together via a connector supported by a supporting member such as a circuit board.

2. Description of the Prior Art

In the following description, an electronic circuit package or an electronic unit means a plurality of electronic parts integrated together. The electronic circuit package or electronic unit includes, for example, a circuit board on which an LSI is mounted, a circuit board on which a connector is mounted, a hard disk unit, and a CPU package.

In the following description, a connector means a device that electrically connects electronic parts. Either a portion having a female terminal or a portion having a male terminal is a connector. Accordingly, a group of terminals provided at an edge of a circuit board is also a connector as in the case of a terminal 65 in FIG. 7.

In the following description, a housing means a device that accommodates or supports electronic units. For example, a case, a cabinet, a rack, a chassis, and a frame are housings.

In a first conventional technique for an apparatus of this kind, a back board 72 has a connector 73, and a plurality of electronic circuit packages 71 are connected to the back board 72 via a connector 74, as shown in FIG. 9. Each of the electronic circuit packages 71 has a circuit board and electronic parts such as LSIs 75 which are mounted on the circuit board. A wiring pattern 77 of the electronic circuit package 71 connects the electronic parts such as the LSIs 75 and the connector 74 together. The connector 74 is connected to a connector 73 to electrically connect the electronic circuit package 71 to another electronic circuit package via a wiring pattern 76 in the back board 72.

In this structure, as shown in FIG. 10, an electronic circuit package 81 is inserted into a connector 82 in its longitudinal direction, that is, perpendicularly to the direction in which terminals 83 of the connector 82 are arranged so that a terminal of the electronic circuit package 81 is connected to the terminal 83 of the connector 82.

Japanese Patent Laid-Open No. 09-172240 discloses a variation of the above first conventional technique. In this variation, packages are connected to the respective surfaces of the back board. Specifically, FIG. 1 of Japanese Patent Laid-Open No. 09-172240 shows a device that electrically connects a group of first packages composed of 16 first packages to a group of second packages composed of 16 second packages, via an adapter 30 having 16 connectors 33 arranged on each of its front and back surfaces. The adapter 30 and the connector 33 correspond to the back board 72 and connector 73, shown in FIG. 9 of this application.

If the apparatus according to the first conventional technique shown in FIG. 9 is mounted in a housing, it is arranged so that the back board 72 is substantially perpendicular to the top or bottom surface of the housing. Then, the electronic circuit package 71 is inserted into the housing through an opening formed in the front surface of the housing. Subsequently, the connector 74 of the electronic circuit package 71 is connected to the connector 73 of the back board 72.

U.S. Pat. No. 6,128,196 discloses a second conventional technique for an apparatus for electrically connecting electronic units together. With reference to FIGS. 2 and 9 of U.S. Pat. No. 6,128,196, a circuit board 102 is inserted into a connector 152 of a motherboard 149 from a direction perpendicular to the longitudinal direction of the connector 152. The motherboard 149 is arranged in a chassis 104 so that the motherboard 149 is parallel to the top surface (or bottom surface) of the chassis 104.

However, the above first conventional technique has the following problems.

A first problem is a decrease in cooling efficiency. If a cooling airflow is allowed to flow parallel to the inserting direction of the electronic circuit package 71, the back board 72 interrupts the airflow. If the size of the back board is reduced to allow the airflow to flow without being interrupted by the back board 72, the size of the connector is also reduced. This in turn reduces the number of signal lines and an amount of a current supply. On the other hand, if the cooling airflow is allowed to flow in a direction parallel to the back board 72, that is, in the vertical direction of FIG. 9, no other devices can be mounted above or below this electronic equipment.

With the second conventional technique, the motherboard 149 is arranged in the chassis 104 so as to be parallel to the top surface (or bottom surface) of the chassis 104. Accordingly, the cooling airflow is parallel to the motherboard 149. Thus, the second conventional technique can solve the above problems of the first conventional technique. However, with the second conventional technique, the circuit board 102 is moved up and down to connect and separate the circuit board 102 to and from the motherboard connector 152, respectively. Thus, it is difficult to connect and separate the circuit board 102 to and from the motherboard connector 152 unless there is a sufficient clearance between the circuit board 102 and the top surface 124 of the chassis 104. This problem is particularly severe when the size of the chassis 104 is reduced.

According to U.S. Pat. No. 6,128,196, a 1⅜-inch clearance is required on an average to connect and separate the circuit board connector 102 to and from the motherboard connector 152. With reference to FIG. 3 of U.S. Pat. No. 6,128,196, the circuit board 102 is accommodated in a framework 159. The framework 159 has a pivot 210. The circuit board 102 can be moved up or down by 1⅜ inches or more by engaging the pivot 210 with a receiving block 220.

However, since the size of the chassis 104 is reduced, it is difficult to connect and separate the circuit board 102 to and from the motherboard 149 when the clearance between the circuit board 102 and the top surface 124 of the chassis 104 is less than 1⅜ inches.

SUMMARY OF THE INVENTION

It is an object of the present invention to improve cooling efficiency without reducing the number of terminals or signal lines of an electronic circuit package. It is another object of the present invention to enable an electronic circuit package and a connector in a housing to be connected together and separated from each other even if there is only a small clearance between the electronic circuit package and a housing.

The inventor has discovered that these objects are accomplished by allowing the electronic circuit package and the connector to be connected together and separated from each other by moving the electronic circuit package in a longitudinal direction of the connector.

An apparatus according to the present invention is adapted to make an electrical connection with a first electronic unit having a first edge portion and first terminals disposed along said first edge portion. The apparatus includes a first supporting member and a first connector supported by the first supporting member. The first connector has a body elongated in a longitudinal direction and second terminals disposed along the longitudinal direction. The first connector is adapted to slidably guide the first edge portion of the first electronic unit along the longitudinal direction to a first fully inserted position such that each one of the first terminals faces respective one of the second terminals. According to the present invention, as shown in FIG. 4, an electronic circuit package 31 is mounted horizontally in an electronic circuit package 32 constituting a support member. A cooling airflow for cooling electronic parts such as LSIs mounted on the electronic circuit package 31 is allowed to flow parallel to a direction in which the electronic circuit package 31 is inserted. Then, the electronic circuit package 32 does not interrupt the cooling airflow. Thus, the cooling efficiency is improved. The high cooling efficiency is obtained without reducing the size of a ZIF connector 33. Consequently, the numbers of terminals and signal lines of an electronic circuit package 11 do not decrease.

According to the present invention, the electronic circuit package 11 is moved along a longitudinal direction of the ZIF connector 33 to connect the electronic circuit package 11 and the ZIF connector 33. Thus, the electronic circuit package 11 and the ZIF connector 33 can be connected together and separated from each other even if there is substantially no clearance between the electronic circuit package 11 and a housing 100.

Moreover, in the arrangement shown in FIG. 1, the electronic circuit package 11 is connected to both electronic circuit packages 12 and 13. It is thus possible to double the number of terminals of the electronic circuit package 11. This increases the upper limit on the number of parts that can be mounted on the electronic circuit package 11. As a result, the number of electronic circuit packages 11 can be reduced.

BRIEF DESCRIPTION OF THE DRAWINGS

This above-mentioned and other objects, features and advantages of this invention will became more apparent by reference to the following detailed description of the invention taken in conjunction with the accompanying drawings, wherein.

DETAILED DESCRIPTION OF THE PREFERRED EMBODIMENTS

With reference to the drawings, a detailed description will be given of the best modes for implemented the present invention.

Figure 1:
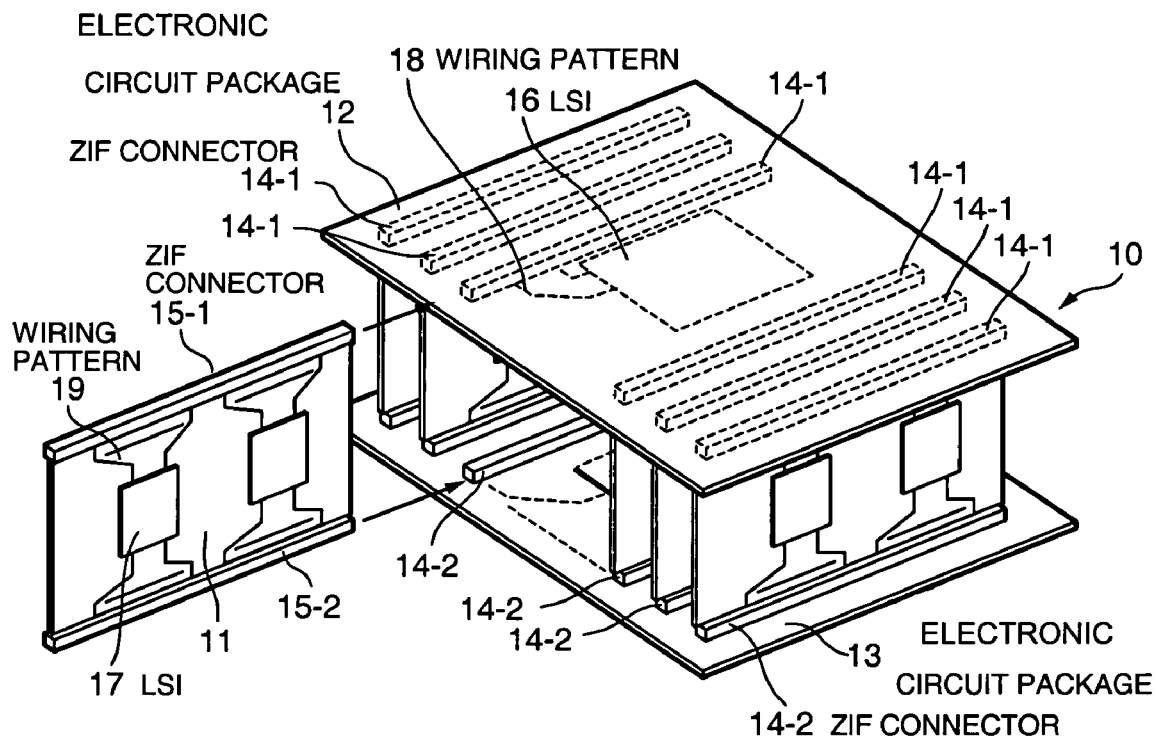
FIG. 1 is a perspective view showing a first embodiment.

FIG. 1 is a perspective view showing a first embodiment. Electronic circuit packages 12 and 13 are support members each of which supports a ZIF (Zero Insertion Force) connector 14. In FIG. 1, the electronic circuit packages 12 and 13 are circuit boards to which ZIF connectors 14-1 and 14-2, respectively, are attached. The electronic circuit package 11 is a circuit board on which electronic parts such as LSIs 17 are mounted. The electronic parts such as the LSIs 17 generate heat and must thus be cooled by air.

In FIG. 1, the ZIF connectors 14-1, an LSI 16, and a wiring pattern 18 mounted under the electronic circuit package 12 are shown by broken lines.

The electronic circuit packages 12 and 13 have the ZIF connectors 14-1 and 14-2, respectively, and the wiring patterns 18. The ZIF connectors 14-1 and 14-2 and the wiring pattern 18 allow a plurality of electronic circuit packages 11 to be electrically connected. An electronic part such as the LSI 16 can be mounted on each of the electronic circuit packages 12 and 13.

The electronic circuit packages 12 and 13 are arranged substantially parallel to each other. The connectors 14-1, arranged on the electronic package 12 are provided parallel to and opposite the connector 14-2, arranged on the electronic circuit package 13. Accordingly, the connectors 14-1, arranged on the electronic circuit 12, are each connected to a ZIF connector 15-1 provided on the top side of a corresponding electronic circuit package 11. The connectors 14-2, arranged on the electronic circuit package 13, are each connected to a ZIF connector 15-2 provided on the bottom side of the corresponding electronic circuit package 11.

Each electronic circuit package 11 has the ZIF connectors 15-1 and 15-2 on its top and bottom sides, respectively, and the ZIF connectors 15-1 and 15-2 are to be connected to ZIF connectors 14-1 and 14-2 of the electronic circuit packages 12 and 13, respectively.

A distance between the electronic circuit packages 12 and 13 is substantially equal to a distance between the ZIF connectors 15-1 and 15-2.

When the electronic circuit package 11 is mounted between the electronic circuit packages 12 and 13, terminals in the connectors 14-1 and 14-2 are brought into an open position. That is, the terminals in the connectors 14-1 and 14-2 are opened in a direction perpendicular to longitudinal directions of the connectors 14-1 and 14-2, respectively. In this case, the ZIF connectors 15-1 and 15-2 can be slid in the longitudinal directions of the ZIF connectors 14-1 and 14-2, respectively. The ZIF connectors 15-1 and 15-2 are guided by the ZIF connectors 14-1 and 14-2, respectively, to their fully inserted positions. In the fully inserted positions, the terminals provided in the ZIF connectors 15-1 and 15-2 face the corresponding terminals in the ZIF connectors 14-1 and 14-2. After the ZIF connectors 15-1 and 15-2 have been moved to their fully inserted positions, the terminals in the ZIF connectors 14-1 and 14-2 are brought into a closed position. The terminals in the ZIF connectors 14-1 and 14-2 are closed and thus electrically connected to the terminals in the ZIF connectors 15-1 and 15-2, respectively.

Thus, the electronic circuit packages 12 and 13 are electrically connected via the electronic circuit package 11. The different electronic circuit packages 11 can be electrically connected via the electronic circuit packages 12 or 13.

It is assumed that a cooling airflow flows in a direction in which the electronic circuit packages 11 are mounted, that is, a direction parallel to the longitudinal directions of the ZIF connectors 14-1 and 14-2. Then, the direction of the cooling airflow is parallel to the electronic circuit package 11, so that the electronic circuit packages 12 and 13 do not interrupt the cooling airflow. Thus, the electronic circuit packages 11 are efficiently cooled. Furthermore, other devices can be mounted on or under the apparatus 10 without reducing the cooling efficiency. Thus, if the apparatus 10 is mounted in a standard rack or the like, multiple devices can be mounted in a vertical direction.

Figure 2:
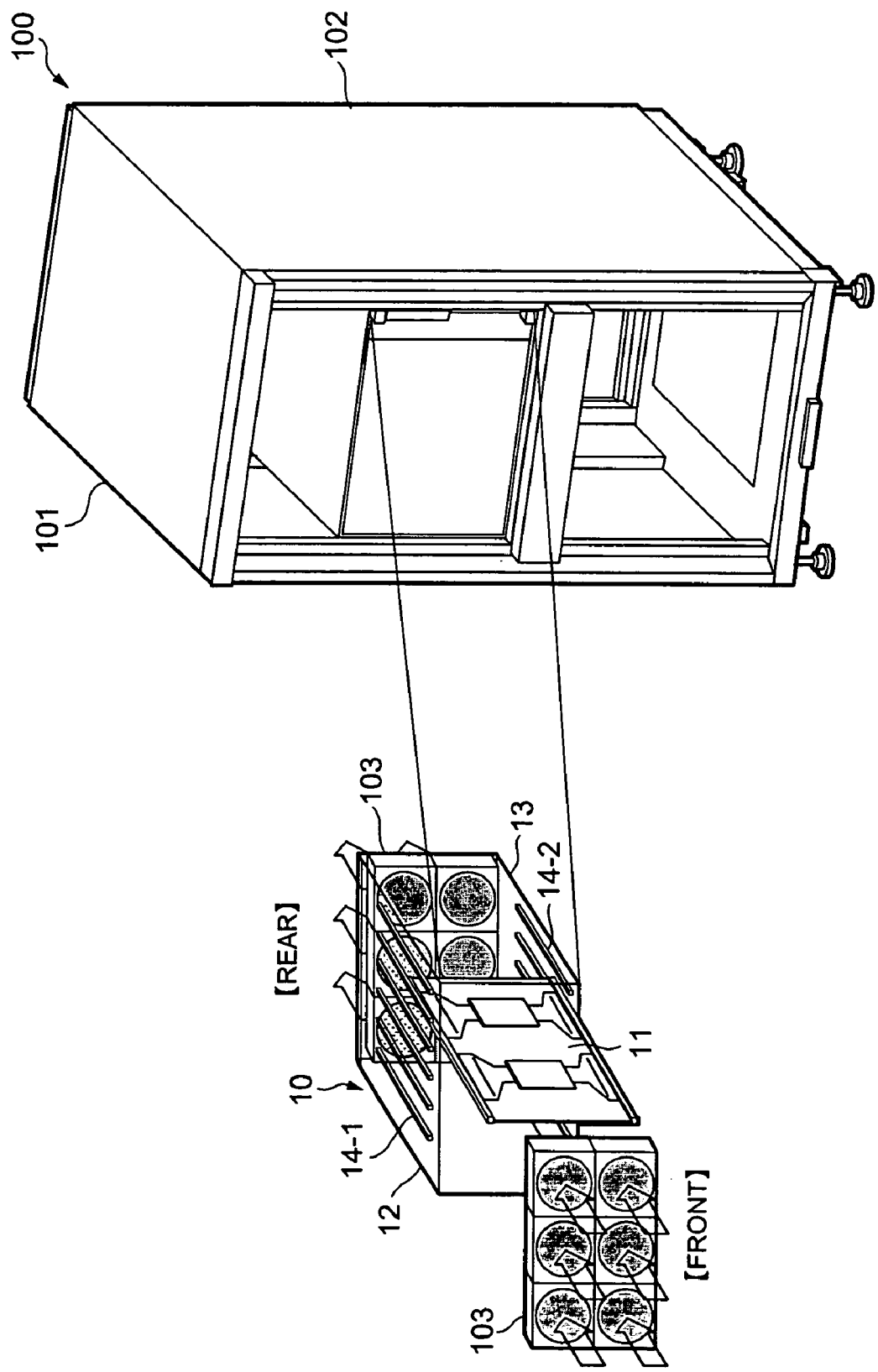
FIG. 2 is a perspective view showing a first embodiment.

FIG. 2 shows that the apparatus 10, which includes the electronic circuit packages 12 and 13, is mounted in a housing 100 with an opening in a front portion of the housing 100. The apparatus 10 is arranged between the opening in the front portion and a rear opening in a rear portion of the housing 100. FIG. 2 shows that the electronic circuit packages 12 and 13 are parallel to the top surface 101 of the housing 100. However, the electronic circuit packages 12 and 13 have only to extend substantially parallel to a direction from the front portion to the rear portion of the housing 100. For example, the electronic circuit packages 12 and 13 may be extended parallel to a side 102 of the housing 100.

In FIG. 2, the connectors 14-1 and 14-2 are provided on the electronic circuit packages 12 and 13, respectively, so that the longitudinal directions of the connectors 14-1 and 14-2 are substantially perpendicular to the front or rear portion of the housing 100, that is, the connectors 14-1 and 14-2 are substantially parallel to the direction from the front portion to rear portion of the housing 100.

The electronic circuit packages 11 are inserted and held between the electronic circuit packages 12 and 13 at an angle substantially perpendicular to the electronic circuit packages 12 and 13 through the opening formed in the front portion of the housing 100.

Furthermore, the housing 100 is provided with a fan 103. The fan 103 provides the apparatus 10 with a cooling airflow in the direction in which the electronic circuit packages 11 are inserted, that is, the longitudinal directions of the connectors 14-1 and 14-2. The fan 103 is provided on the front or rear portion of the housing 100 or on both portions. The fan 103 may be provided at another position providing that a cooling airflow can be allowed to flow in the above described direction using means such as a guide.

Since the electronic circuit packages 12 and 13 are provided substantially perpendicularly to the front surface of the housing 100, the direction of the airflow is parallel to the electronic circuit packages 12 and 13. Thus, the electronic circuit packages 12 and 13 do not interrupt the airflow. Consequently, the electronic circuit packages 11 can be efficiently cooled.

Figure 3:
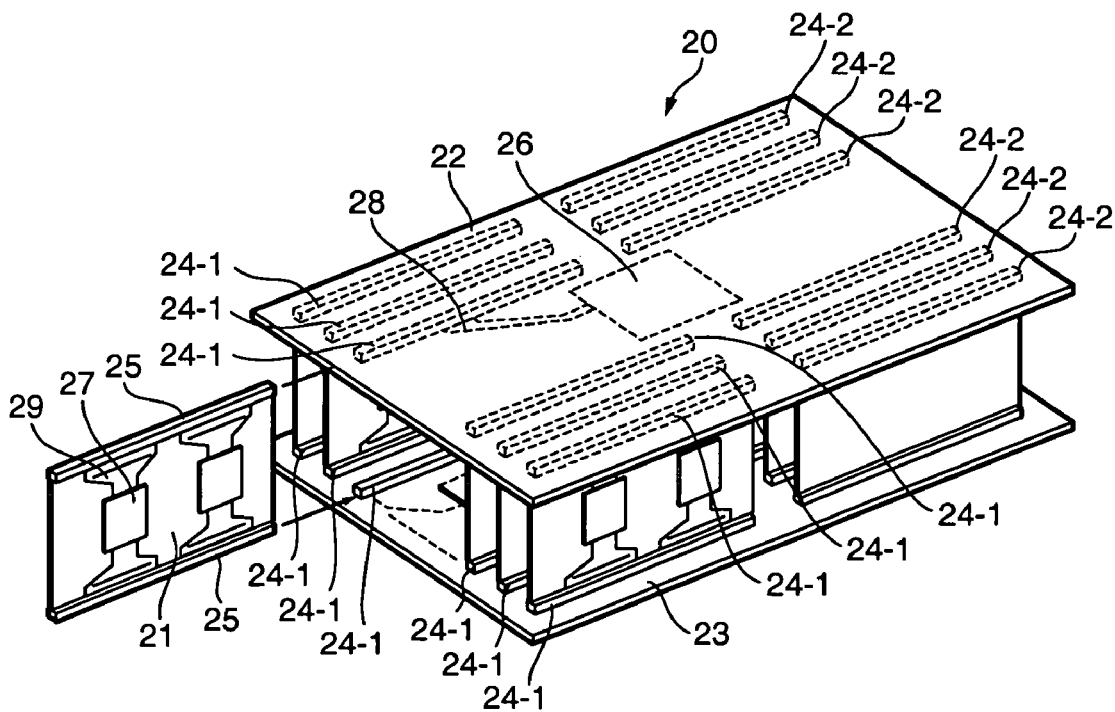
FIG. 3 is a perspective view showing a second embodiment.

FIG. 3 is a perspective view showing a second embodiment.

In FIG. 3, electronic circuit packages 22 and 23 are circuit boards to which ZIF connectors 24-1 and 24-2 are attached. Electronic circuit packages 21 are circuit boards on which electronic parts such as LSIs 27 are mounted. The electronic parts such as the LSIs 27 generate heat and must thus be cooled by air.

In FIG. 3, the ZIF connectors 24-1 and 24-2, an LSI 26, and a wiring pattern 28 that are mounted under the electronic circuit package 22 are shown by broken lines.

Each of the electronic circuit packages 22 and 23 have the ZIF connectors 24-2 and 24-1 and the wiring pattern 28. The ZIF connectors 24-1 and 24-2 and the wiring pattern 28 allow a plurality of electronic circuit packages 21 to be electrically connected. An electronic part such as the LSI 26 can be mounted on each of the electronic circuit packages 22 and 23.

The ZIF connectors 24-2 are arranged adjacent to the ZIF connectors 24-1 on each of the electronic circuit packages 22 and 23. More specifically, the ZIF connectors 24-2 are arranged in an area adjacent to a short side of the ZIF connectors 24-1. The ZIF connectors 24-1 and 24-2 may be arranged in overlapping areas. In this case, the ZIF connectors 24-1 and 24-2 are arranged alternately in a staggered format.

The longitudinal direction of the ZIF connectors 24-2 is substantially parallel to the longitudinal direction of the ZIF connectors 24-1. However, the direction in which the electronic circuit packages 21 are inserted through the ZIF connectors 24-2 is substantially opposite to the direction in which the electronic circuit packages 21 are inserted through the ZIF connectors 24-1. Consequently, the different electronic circuit packages 21 can be inserted from either end of the electronic circuit packages 22 and 23. The electronic circuit packages 21 inserted through the ZIF connectors 24-1 can be electrically connected to the electronic circuit packages 21 inserted through the ZIF connectors 24-2, via the electronic circuit package 22 or 23.

The arrangement in FIG. 3 may be varied so that the ZIF connectors 24-2 are arranged in an area adjacent to a long side of an outermost one of the ZIF connectors 24-1.

Furthermore, if the apparatus 20 is mounted in the housing 100 such as the one shown in FIG. 2, openings are formed in the front and rear portions, respectively, of the housing 100. The electronic circuit packages 21 are inserted between the electronic circuit packages 22 and 23 at an angle substantially perpendicular to the electronic circuit packages 22 and 23 via the front or rear opening in the housing 100.

Figure 4:
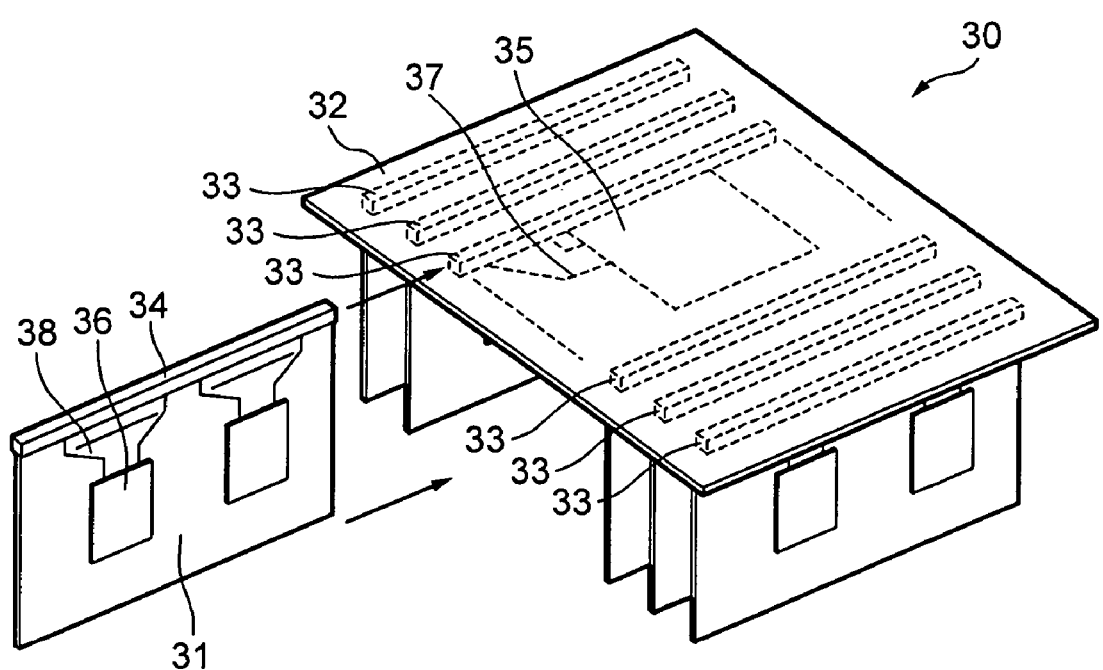
FIG. 4 is a perspective view showing a third embodiment.

FIG. 4 is a perspective view showing a third embodiment. In FIG. 4, an electronic circuit package 32 is a circuit board to which ZIF connectors 33 are attached. Electronic circuit packages 31 are circuit boards on which electronic parts such as LSIs 36 are mounted. The electronic parts such as the LSIs 36 generate heat and must thus be cooled by air.

In FIG. 4, the ZIF connectors 33, an LSI 35, and a wiring pattern 37 mounted under the electronic circuit package 32 are shown by broken lines.

The electronic circuit package 32 has the ZIF connectors 33 and the wiring pattern 37. The ZIF connectors 33 and the wiring pattern 37 allow a plurality of electronic circuit packages 31 to be electrically connected. An electronic part such as an LSI 35 can be mounted on the electronic circuit package 32.

Each electronic circuit package 31 has a ZIF connector 34 on one side of it. The ZIF connector 34 of the electronic circuit package 31 is inserted through one of the ZIF connector 33 of the electronic circuit package 32 for electric connection.

When the electronic circuit package 31 is mounted on the electronic circuit package 32, terminals in the ZIF connector 33 is brought into an open position. That is, terminals in the ZIF connector 33 are opened in a direction perpendicular to longitudinal direction of the ZIF connector 33. In this case, the ZIF connector 34 can be slid in the longitudinal direction of the ZIF connector 33. The ZIF connector 34 is guided by the connector 33 to its fully inserted position. In the fully inserted position, the terminals provided in the ZIF connector 34 face the corresponding terminals in the ZIF connector 33.

After the ZIF connector 34 has been moved to its fully inserted position, the terminals in the ZIF connector 33 are brought into a closed position. The terminals in the ZIF connector 33 are closed and thus electrically connected to the group of terminals in the ZIF connector 34.

The different electronic circuit packages 31 can be electrically connected together via the electronic circuit package 32.

When the apparatus 30 is mounted in the housing 100, the electronic circuit package 32 is provided perpendicularly to the front portion of the housing 100. For example, the electronic circuit package 32 is provided parallel to the side 102 of the housing 100. Alternatively, the electronic circuit package 32 is provided parallel to the top surface 101 of the housing 100. The connector 33 is provided on the electronic circuit package 32 so that its longitudinal direction is parallel to the direction from the front portion to rear portion of the housing.

The housing 100 has an opening in its front portion. The electronic circuit packages 31 are mounted on the electronic circuit package 32 at an angle substantially perpendicular to the electronic circuit package 32 through the opening formed in the front portion of the housing 100.

Furthermore, the housing 100 is provided with the fan 103. The fan 103 provides the apparatus 30 with a cooling airflow in the direction in which the electronic circuit packages 31 are inserted, that is, the longitudinal directions of the connectors 33. Accordingly, the fan 103 supplies a cooling airflow in the direction from the front portion to the rear portion of the housing.

As in the case of the first embodiment, the electronic circuit package 32 is positioned substantially perpendicularly to the front portion of the housing. Thus, the electronic circuit package 32 does not interrupt the airflow because the direction of the airflow is parallel to the electronic circuit package 32. Consequently, the electronic circuit packages 31 can be effectively cooled.

Figure 5:
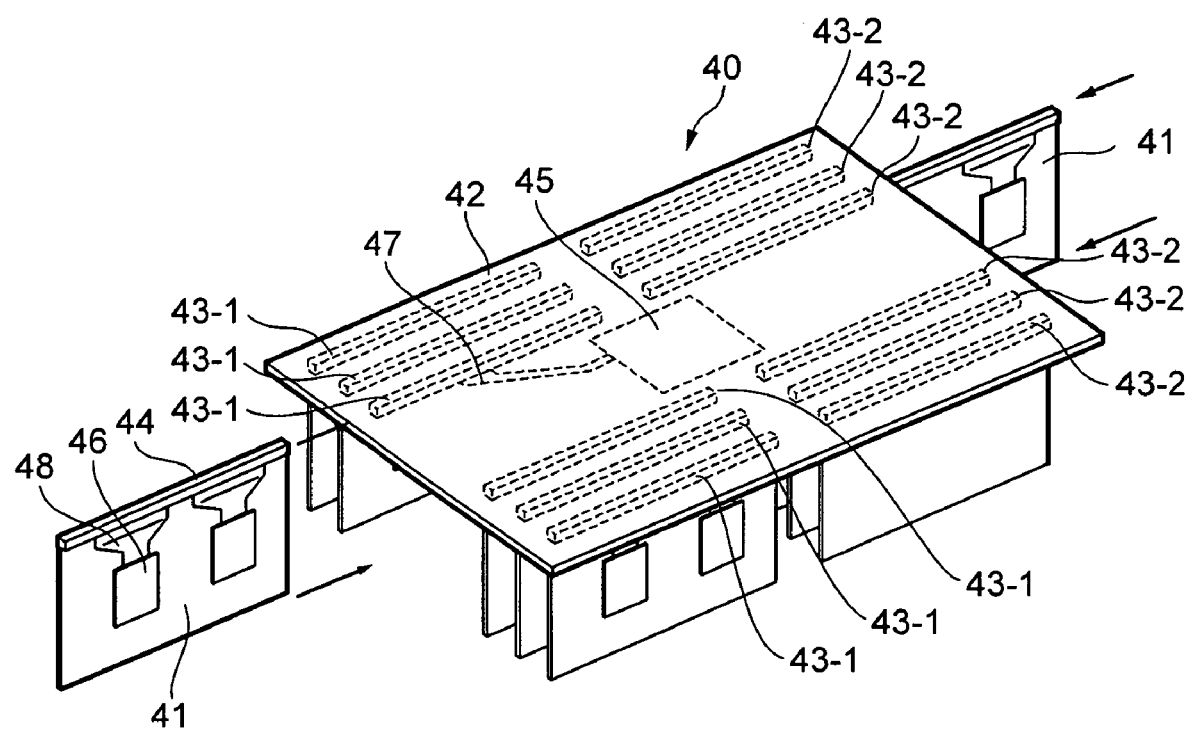
FIG. 5 is a perspective view showing a forth embodiment.

FIG. 5 is a perspective view showing a fourth embodiment. In FIG. 5, an electronic circuit package 42 is a circuit board to which ZIF connectors 43-1 and 43-2 are attached. Electronic circuit packages 41 are circuit boards on which electronic parts such as LSIs 46 are mounted. The electronic parts such as the LSIs 46 generate heat and must thus be cooled by air.

In FIG. 5, the ZIF connectors 43-1, an LSI 45, and a wiring pattern 47 that are mounted under the electronic circuit package 42 are shown by broken lines.

This embodiment differs from the third embodiment in that the electronic circuit packages 41 can be mounted in the housing through either end of the electronic circuit package 42. The ZIF connectors 43-2 are arranged -adjacent to the ZIF connectors 43-1 on the electronic circuit package 42. More specifically, the ZIF connectors 43-2 are arranged in an area adjacent to a short side of the ZIF connectors 43-1. The ZIF connectors 43-1 and 43-2 may be arranged in overlapping areas. In this case, the ZIF connectors 43-1 and 43-2 are arranged alternately in a staggered format.

The longitudinal direction of the ZIF connectors 43-2 is substantially parallel to the longitudinal direction of the ZIF connectors 43-1. However, the direction in which the electronic circuit packages 41 are inserted through the ZIF connectors 43-2 is substantially opposite to the direction in which the electronic circuit packages 41 are inserted through the ZIF connectors 43-1. Consequently, the electronic circuit packages 41 can be inserted into the housing from either end of the electronic circuit package 42. The electronic circuit packages 41 inserted through the ZIF connectors 43-1 can be electrically connected to the electronic circuit packages 41 inserted through the ZIF connectors 43-2, via the electronic circuit package 32.

The arrangement in FIG. 5 may be varied so that the ZIF connectors 43-2 are arranged in an area adjacent to a long side of an outermost one of the ZIF connectors 43-1.

Furthermore, if the apparatus 40 is mounted in the housing 100 such as the one shown in FIG. 2, openings are formed in the front and rear portions, respectively, of the housing 100. The electronic circuit packages 41 are mounted on the electronic circuit package 42 at an angle substantially perpendicular to the electronic circuit package 42 via the front or rear opening in the housing 100.

Figure 6:
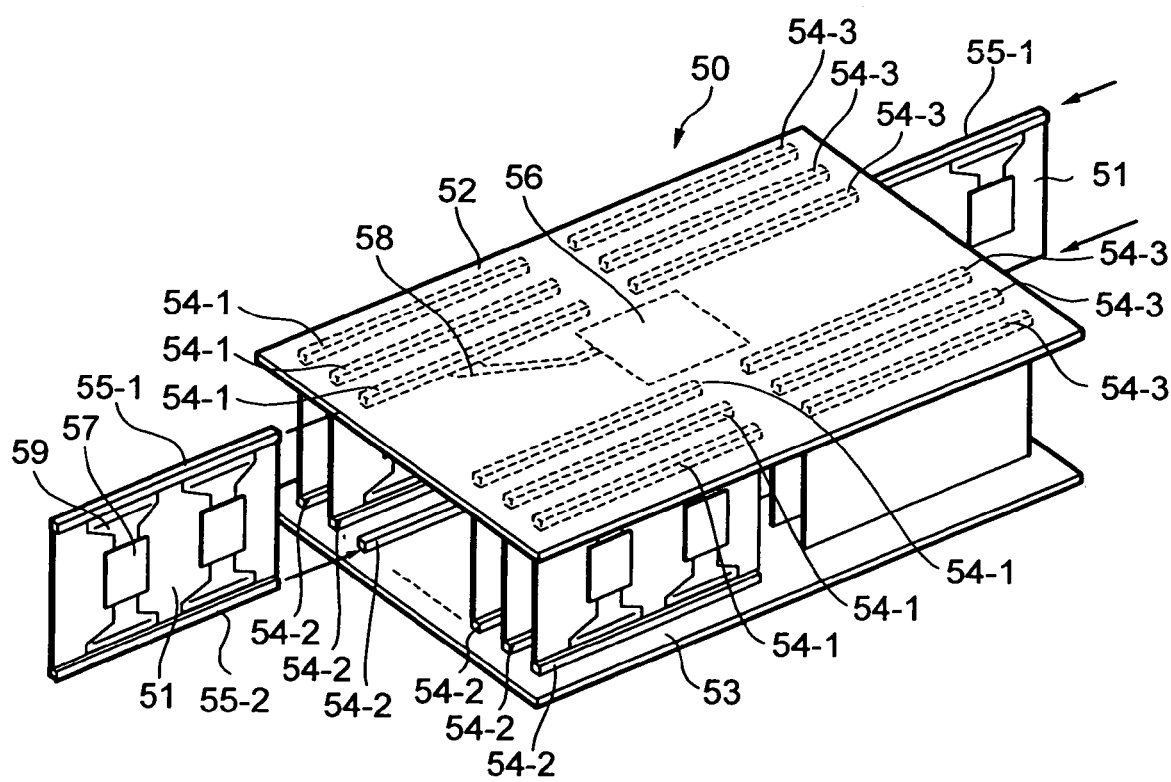
FIG. 6 is a perspective view showing a fifth embodiment.

FIG. 6 is a perspective view showing a high-density mounting structure according to a fifth embodiment. In FIG. 6, electronic circuit packages 52 and 53 are circuit boards to which ZIF connectors 54-1, 54-2, and 54-3 are attached. Electronic circuit packages 51 are circuit boards on which electronic parts such as LSIs 57 are mounted. The electronic parts such as the LSIs 57 generate heat and must thus be cooled by air.

In the present embodiment, the ZIF connectors 54-3 are arranged adjacent to the ZIF connectors 54-1 only on the electronic circuit package 52. The longitudinal direction of the ZIF connectors 54-3 is substantially parallel to the longitudinal direction of the ZIF connectors 54-1. However, the direction in which the electronic circuit packages 51 are inserted through the ZIF connectors 54-3 is opposite to the direction in which the electronic circuit packages 51 are inserted through the ZIF connectors 54-1.

If the electronic circuit package 51 is inserted from one side of the apparatus 50, ZIF connectors 55-1 and 55-2 of the electronic circuit package 51 are connected to the corresponding ZIF connectors 54-1 and 54-2 of the electronic circuit packages 52 and 53, respectively. On the other hand, if the electronic circuit package 51 is inserted from the opposite side of the apparatus 50, the ZIF connector 55-1 of the electronic circuit package 51 is connected to the corresponding ZIF connector 54-3 of the electronic circuit package 52.

As in the case of the second and fourth embodiments, openings are formed in the front and rear portions, respectively, of the housing 100, in which the apparatus 50 is mounted. The electronic circuit packages 51 are inserted between the electronic circuit packages 52 and 53 via the front or rear opening in the housing 100.

Figure 7:
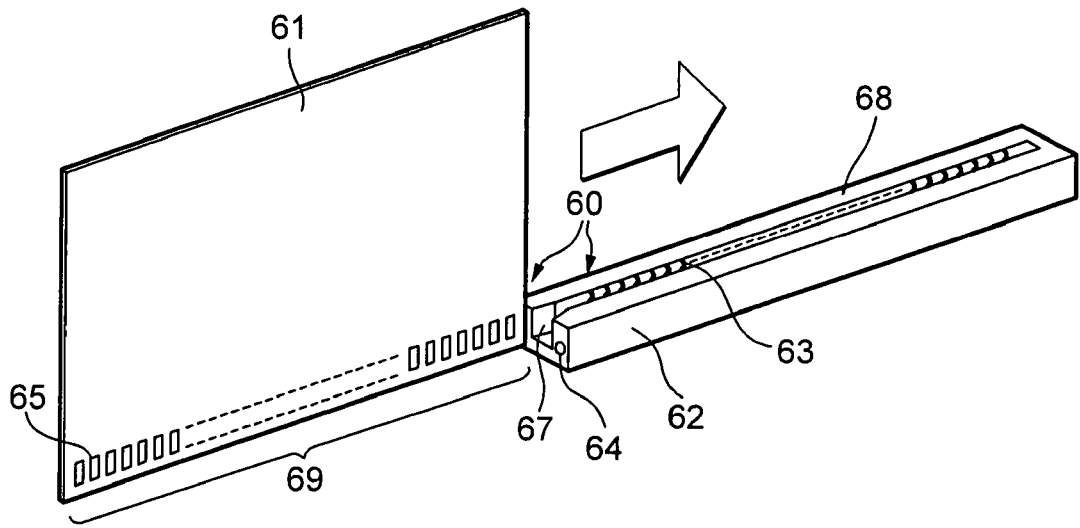
FIG. 7 is a perspective view showing a connector, in an open state, for embodying the first to fifth embodiments.

FIG. 7 is a perspective view showing connectors for implementing the first to fifth embodiments.

A ZIF connector 60 is supported on an electronic circuit packages, which is a support member. The ZIF connector 60 includes a female connector 62 and a edge portion 69 of the electronic circuit package 61. The female connector 62 has an opening 67 in its short side to receive the edge portion 69 of the electronic circuit package 61. A guide 68 is arranged along a long side of the female connector 62 and is connected to the opening 67. The electronic circuit package 61 can be slid along the guide 68 in a longitudinal direction of the female connector 62. The guide 68 guides the electronic circuit package 61 to a fully inserted position.

Figure 7A:
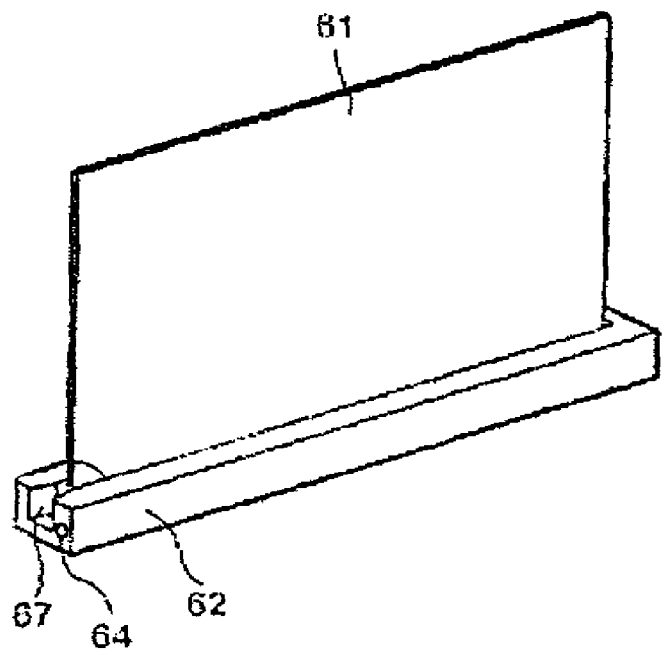
FIG. 7a is a perspective view showing the connector of FIG. 7 in a closed state.

The ZIF connector 60 in FIGS. 7 and 7a has a lock mechanism. The lock mechanism locks the edge portion 69 of the electronic circuit package 61 in the female connector 62 as the fully inserted position of the ZIF connector 60. The lock mechanism includes a terminal opening and closing mechanism 64 and terminals 63. The terminals 63 can operate to engage (as shown in FIG. 7a) and disengage the edge portion 69 of the electronic circuit package 61 is in accordance with an operation of the opening and closing mechanism 64. If the edge portion 69 of the electronic circuit package 61 is inserted into the female connector 62 or disengaged or removed from the female connector 62, the opening and closing mechanism 64 is operated. The operation of the opening and closing mechanism 64 opens the terminals 63 in a direction perpendicular to the longitudinal direction of the female connector 62. On the other hand if the edge portion 69 of the electronic circuit package 61 is locked in the female connector 62, the opening and closing mechanism 64 is operated. The operation of the opening and closing mechanism 64 closes the terminals 63 in the direction perpendicular to the longitudinal direction of the female connector 62.

The electronic circuit package 61 has terminals 65 that can be connected to the female connector 62 along the edge portion 69 of the electronic circuit package 61. The edge portion 69 of the electronic circuit package 61 is inserted into the opening 67 of the female connector 62 while the terminal 63 of the female connector 62 is open. The edge portion 69 of the electronic circuit package 61 is inserted into the female connector 62 while being slid in the longitudinal direction of the connector 62. The electronic circuit package 61 is inserted into the female connector 62 to a fully inserted position of the female connector 62. At the fully inserted position, the terminals 65 of the electronic circuit package 61 face the corresponding terminals 63 of the connector 62. After the electronic circuit package 61 has been inserted to the fully inserted position, the connector contact opening and closing mechanism 64 is operated. The operation of the connector contact opening and closing mechanism 64 closes the terminals 63. Once the terminals 63 are closed, the edge portion 69 of the electronic circuit package 61 is fixed to the female connector 62. The terminals 63 and 65 are electrically connected, respectively.

If a connector is present on both opposite electronic circuit packages (for example, electronic circuit packages 12 and 13) as in the case of the first, second, and fifth embodiments, the electronic circuit package 61 has the terminal 65 at both edge portions of the electronic circuit package 61.

Figure 8:
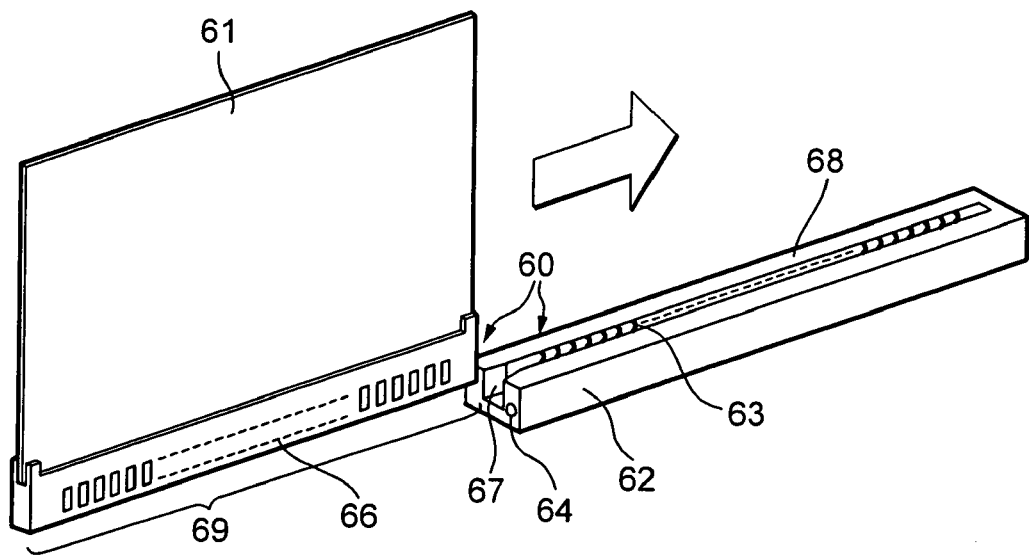
FIG. 8 is a perspective view showing a second connector, in an open state, for embodying the first to fifth embodiments.
Figure 8A:
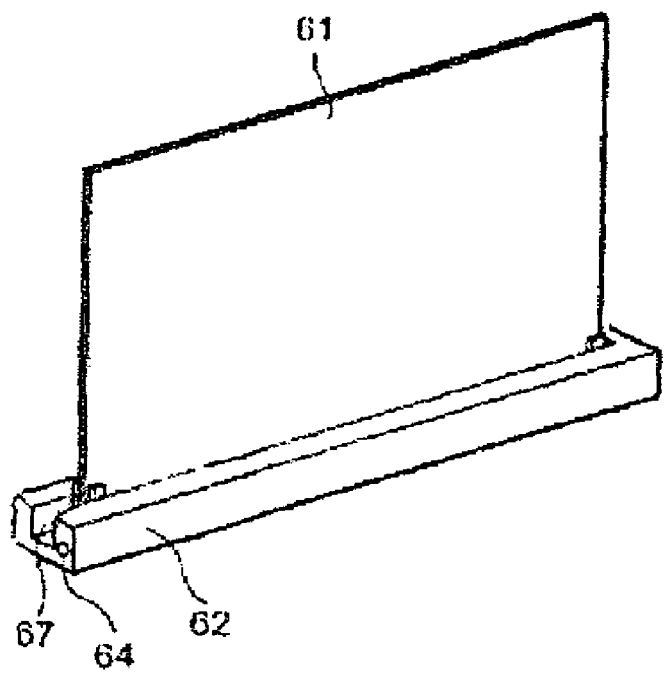
FIG. 8a is a perspective view showing the connector of FIG. 8 in a closed state.
Figure 9:
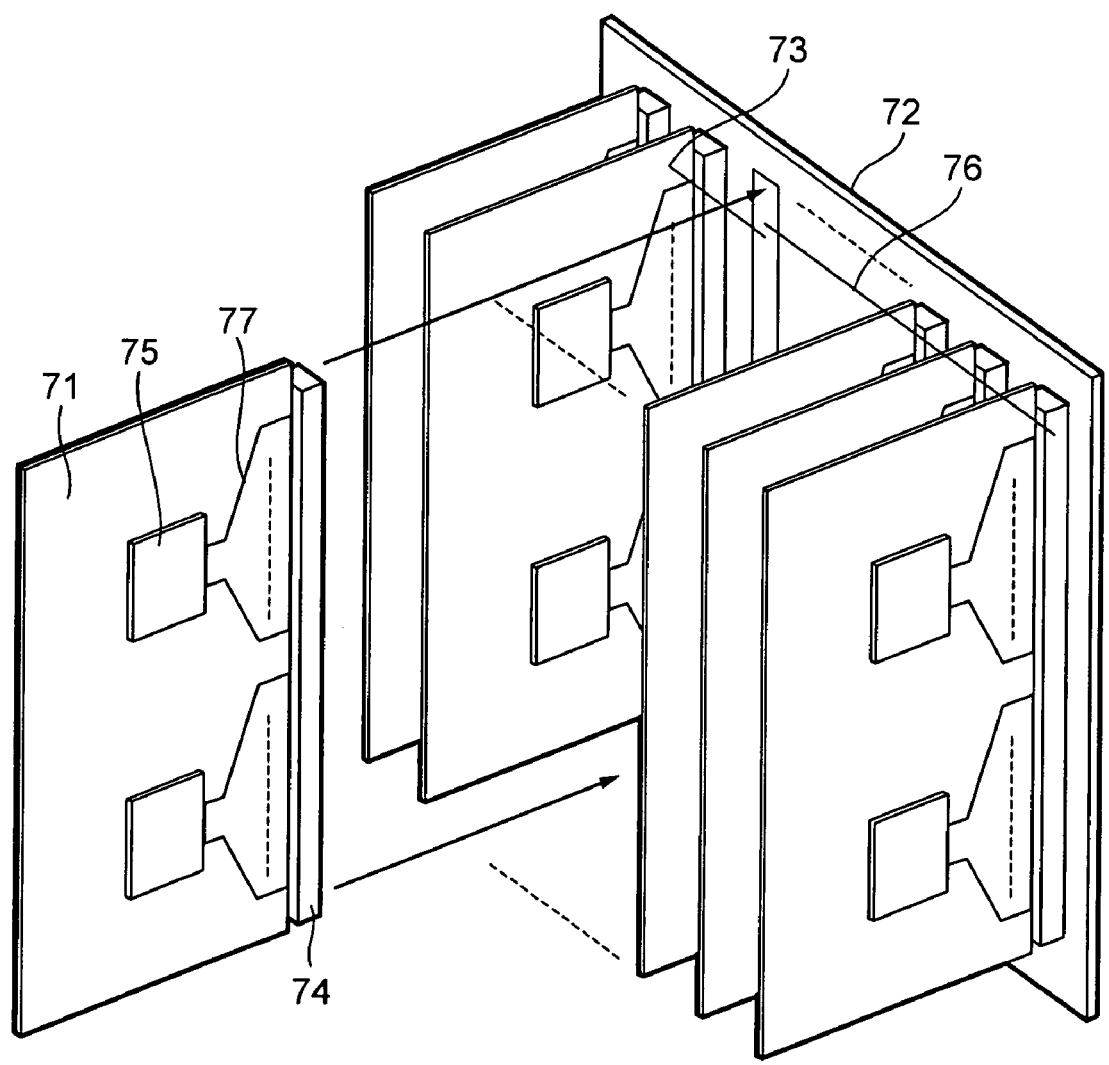
FIG. 9 is a perspective view showing a configuration in the prior art.
Figure 10:
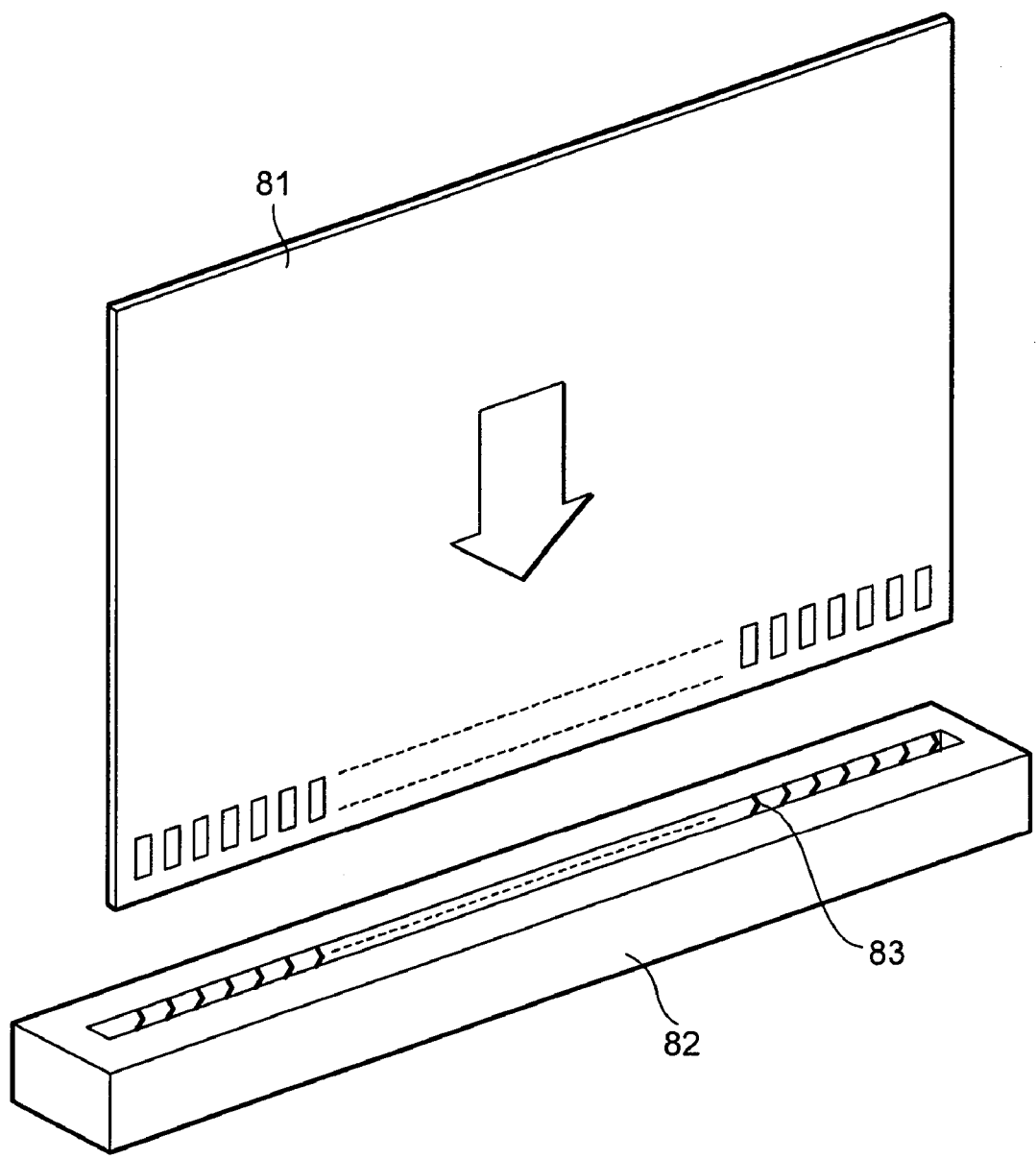
FIG. 10 is a perspective view showing a connector construction in the prior art.

FIGS. 8 and 8a are perspective views showing a second connector for implementing the first to fifth embodiments.

The second connector differs from the connector shown in FIGS. 7 and 7a in that the electronic circuit package 61 has a male connector 66 at an edge portion 69 of the electronic circuit package 61. The electronic circuit package 61 is electrically connected to the connector 62 via the male connector 66 (as shown in FIG. 8a).

If a connector is present on both opposite electronic circuit packages (for example, electronic circuit packages 12 and 13 as in the case of the first, second, and fifth embodiments, the electronic circuit package 61 has a terminal 66 at both edge portions of the electronic circuit package 61.

In the third and fourth embodiments, shown in FIGS. 4 and 5, the electronic circuit packages 32 and 42 may be provided on the bottom surfaces of the electronic circuit packages 31 and 41, respectively, instead of their top surfaces.

The connectors used in the embodiment need not be ZIF connectors but may be any connectors that can be connected to a corresponding connector by inserting the corresponding connector along the longitudinal direction of the connector.

The present invention has been described in detail. However, it should be appreciated that various changes may be made to the present invention without departing from its spirits.

What is claimed is:

1. An apparatus adapted to make an electrical connection with a first electronic unit having a first edge portion and first terminals disposed along said first edge portion, said apparatus comprising:
   a first supporting member; and
   a first connector supported by said first supporting member, said first connector having a body elongated in a longitudinal direction and second terminals disposed along said longitudinal direction, wherein:
   said first connector is adapted to slidably guide said first edge portion of said first electronic unit along said longitudinal direction to a first fully inserted position such that each one of said first terminals faces a respective one of said second terminals; and
   said first connector includes a first lock mechanism locking said first edge portion of said first electronic unit at said first fully inserted position and connecting said first terminals and said second terminals electrically, wherein:
   said first electronic unit further has a second edge portion substantially parallel and opposite to said first edge portion and fourth terminals disposed along said second edge portion,
   said apparatus further includes a second supporting member and a second connector;
   said second connector has a body elongated in a longitudinal direction and third terminals disposed along said longitudinal direction of said second connector,
   said second connector is supported by said second supporting member and arranged substantially parallel and opposite to said first connector, and
   said second connector is adapted to slidably guide said second edge portion of said first electronic unit along said longitudinal direction of said second connector to said first fully inserted position such that each one of said third terminals faces a respective one of said fourth terminals.

2. The apparatus according to claim 1, wherein said supporting member includes a circuit board.

3. The apparatus according to claim 1, wherein a direction of a cooling airflow is substantially parallel to said longitudinal direction of said first connector.

4. The apparatus according to claim 1, further comprising a housing having a front portion, a rear portion and a front opening in said front portion, wherein
   said first supporting member and said first connector are arranged between said front portion and said rear portion of said housing.

5. The apparatus according to claim 4, wherein said longitudinal direction of said first connector is substantially parallel to a direction from said front portion to said rear portion of said housing.

6. The apparatus according to claim 5, wherein said housing further has a fan providing a cooling airflow in a direction from said front portion to said rear portion of said housing.

7. The apparatus according to claim 4, wherein said first supporting member is substantially perpendicular to said front portion of said housing.

8. The apparatus according to claim 1, wherein said second connector includes a second lock mechanism locking said second edge portion of said first electronic unit at said first fully inserted position and connecting said third terminals and said fourth terminals electrically.

9. The apparatus according to claim 1, wherein each of said first supporting member and said second supporting member includes a circuit board.

10. The apparatus according to claim 1, wherein a direction of a cooling airflow is substantially parallel to said longitudinal direction of said first connector.

11. The apparatus according to claim 1, further comprising a housing having a front portion, a rear portion and a front opening in said front portion, wherein said first supporting member, said second supporting member, said first connector and said second connector are arranged between said front portion and said rear portion of said housing.

12. The apparatus according to claim 11, wherein said longitudinal direction of said first connector is substantially parallel to a direction from said front portion to said rear portion of said housing.

13. The apparatus according to claim 12, wherein said housing further has a fan providing a cooling airflow in a direction from said front portion to said rear portion.

14. The apparatus according to claim 11, wherein said first and second supporting members are substantially perpendicular to said front portion of said housing.

15. The apparatus according to claim 1, wherein said first supporting member and said second supporting member are adapted to be electrically connected through said first electronic unit.

16. The apparatus according to claim 1, wherein said first and second supporting members are parallel to each other.

17. The apparatus according to claim 16, wherein said first and second connectors are adapted to support said first electronic unit such that said first electronic unit is substantially perpendicular to said first and second supporting members.

18. The apparatus according to claim 1, wherein:
said apparatus is further adapted to make an electrical connection with a second electronic unit having a third edge portion and fifth terminals disposed along said third edge portion;
said apparatus further comprises a third connector supported by said first supporting member;
said third connector has a body elongated in a longitudinal direction and sixth terminals disposed along said longitudinal direction of said third connector;
said third connector is adapted to slidably guide said third edge portion of said second electronic unit along said longitudinal direction of said third connector to a second fully inserted position such that each one of said fifth terminals faces a respective one of said sixth terminals;
said first electronic unit is slidably inserted into said first connector in a first direction along said longitudinal direction of said first connector; and
said second electronic unit is slidably inserted into said third connector in a second direction substantially opposite to said first direction.

19. The apparatus according to claim 18, said third connector is arranged substantially parallel to said first connector.

20. The apparatus according to claim 18, further comprising a housing having a front portion, a rear portion, a front opening on said front portion and a rear opening on said rear portion, wherein
said first supporting member, said first connector and said third connector are arranged between said front portion and said rear portion of said housing.

21. The apparatus according to claim 1, wherein:
said apparatus is further adapted to make an electrical connection with a second electronic unit having a third edge portion and fifth terminals disposed along said third edge portion;
said apparatus further comprises a third connector;
said third connector has a body elongated in a longitudinal direction and sixth terminals disposed along said longitudinal direction of said third connector;
said third connector is supported by said first supporting member;
said third connector is adapted to slidably guide a third edge portion of said second electronic unit along said longitudinal direction of said third connector to a second fully inserted position such that each one of said fifth terminals faces a respective one of said sixth terminals;
said first electronic unit is slidably inserted into said first and second connectors in a first direction along said longitudinal direction of said first connector; and
said second electronic unit is slidably inserted into said third connector in a second direction substantially opposite to said first direction.

22. The apparatus according to claim 21, further comprising a housing having a front portion, a rear portion, a front opening in said front portion and a rear opening in said rear portion, wherein
said first and second supporting members and said first, second and third connectors are arranged between said front portion and said rear portion of said housing.

23. The apparatus according to claim 21, wherein said first and second supporting members are parallel to each other, and said third connector is arranged substantially parallel to said first connector.

24. The apparatus according to claim 1, wherein said first electronic unit is connected to said first connector.

25. An apparatus adapted to make an electrical connection with a first electronic unit having a first edge portion and first terminals disposed along said first edge portion, said apparatus comprising:
a first supporting member; and
a first connector supported by said first supporting member, said first connector having a body elongated in a longitudinal direction and second terminals disposed along said longitudinal direction, wherein:
said first connector is adapted to slidably guide said first edge portion of said first electronic unit along said longitudinal direction to a first fully inserted position such that each one of said first terminals faces a respective one of said second terminals;
said first electronic unit further has a second edge portion substantially parallel and opposite to said first edge portion and fourth terminals disposed along said second edge portion;
said apparatus further includes a second supporting member and a second connector;
said second connector has a body elongated in a longitudinal direction and third terminals disposed along said longitudinal direction of said second connector;
said second connector is supported by said second supporting member and arranged substantially parallel and opposite to said first connector;
said second connector is adapted to slidably guide said second edge portion of said first electronic unit along said longitudinal direction of said second connector to said first fully inserted position such that each one of said third terminals faces a respective one of said fourth terminals;

said first connector includes a first lock mechanism locking said first edge portion of said first electronic unit at said first fully inserted position and connecting said first terminals and said second terminals electrically; and said second connector includes a second lock mechanism locking said second edge portion of said first electronic unit at said first fully inserted position and connecting said third terminals and said fourth terminals electrically.

26. An apparatus adapted to make an electrical connection with a first electronic unit having a first edge portion and first terminals disposed along said first edge portion, said apparatus comprising:

a first supporting member; and a first connector supported by said first supporting member, said first connector having a body elongated in a longitudinal direction and second terminals disposed along said longitudinal direction, wherein:

said first connector is adapted to slidably guide said first edge portion of said first electronic unit along said longitudinal direction to a first fully inserted position such that each one of said first terminals faces a respective one of said second terminals;

said first electronic unit further has a second edge portion substantially parallel and opposite to said first edge portion and fourth terminals disposed along said second edge portion;

said apparatus further includes a second supporting member and a second connector;

said second connector has a body elongated in a longitudinal direction and third terminals disposed along said longitudinal direction of said second connector;

said second connector is supported by said second supporting member and arranged substantially parallel and opposite to said first connector, and said second connector is adapted to slidably guide said second edge portion of said first electronic unit along said longitudinal direction of said second connector to said first fully inserted position such that each one of said third terminals faces a respective one of said fourth terminals, said apparatus further comprising a housing having a front portion, a rear portion and a front opening in said front portion, wherein said first supporting member, said second supporting member, said first connector and said second connector are arranged between said front portion and said rear portion of said housing.

27. The apparatus according to claim 26, wherein said longitudinal direction of said first connector is substantially parallel to a direction from said front portion to said rear portion of said housing.

28. The apparatus according to claim 27, wherein said housing further has a fan providing a cooling airflow in a direction from said front portion to said rear portion.

29. The apparatus according to claim 26, wherein said first and second supporting members are substantially perpendicular to said front portion of said housing.

30. An apparatus adapted to make an electrical connection with a first electronic unit having a first edge portion and first terminals disposed along said first edge portion, said apparatus comprising:

a first supporting member; and a first connector supported by said first supporting member, said first connector having a body elongated in a longitudinal direction and second terminals disposed along said longitudinal direction, wherein:

said first connector is adapted to slidably guide said first edge portion of said first electronic unit along said longitudinal direction to a first fully inserted position such that each one of said first terminals faces a respective one of said second terminals;

said apparatus is further adapted to make an electrical connection with a second electronic unit having a third edge portion and fifth terminals disposed along said third edge portion;

said apparatus further comprises a third connector supported by said first supporting member;

said third connector has a body elongated in a longitudinal direction and sixth terminals disposed along said longitudinal direction of said third connector;

said third connector is adapted to slidably guide said third edge portion of said second electronic unit along said longitudinal direction of said third connector to a second fully inserted position such that each one of said fifth terminals faces a respective one of said sixth terminals;

said first electronic unit is slidably inserted into said first connector in a first direction along said longitudinal direction of said first connector; and said second electronic unit is slidably inserted into said third connector in a second direction substantially opposite to said first direction.

31. The apparatus according to claim 30, said third connector is arranged substantially parallel to said first connector.

32. The apparatus according to claim 30, further comprising a housing having a front portion, a rear portion, a front opening on said front portion and a rear opening on said rear portion, wherein said first supporting member, said first connector and said third connector are arranged between said front portion and said rear portion of said housing.

33. An apparatus adapted to make an electrical connection with a first electronic unit having a first edge portion and first terminals disposed along said first edge portion, said apparatus comprising:

a first supporting member; and a first connector supported by said first supporting member, said first connector having a body elongated in a longitudinal direction and second terminals disposed along said longitudinal direction, wherein:

said first connector is adapted to slidably guide said first edge portion of said first electronic unit along said longitudinal direction to a first fully inserted position such that each one of said first terminals faces a respective one of said second terminals;

said apparatus is further adapted to make an electrical connection with a second electronic unit having a third edge portion and fifth terminals disposed along said third edge portion;

said apparatus further comprises a third connector;

said third connector has a body elongated in a longitudinal direction and sixth terminals disposed along said longitudinal direction of said third connector;

said third connector is supported by said first supporting member;

said third connector is adapted to slidably guide a third edge portion of said second electronic unit along said longitudinal direction of said third connector to a second fully inserted position such that each one of said fifth terminals faces a respective one of said sixth terminals;

said first electronic unit is slidably inserted into said first and second connectors in a first direction along said longitudinal direction of said first connector; and said second electronic unit is slidably inserted into said third connector in a second direction substantially opposite to said first direction.

34. The apparatus according to claim 33, further comprising a housing having a front portion, a rear portion, a front opening in said front portion and a rear opening in said rear portion, wherein said first and second supporting members and said first, second and third connectors are arranged between said front portion and said rear portion of said housing.

35. The apparatus according to claim 33, wherein said first and second supporting members are parallel to each other, and said third connector is arranged substantially parallel to said first connector.

36. An apparatus adapted to make an electrical connection with a first electronic unit having a first edge portion and first terminals disposed along said first edge portion, said apparatus comprising:

a housing comprising side walls, a front wall and a rear wall;

a fan mounted on the rear portion aligned to direct a cooling airflow in a first direction;

a second fan mounted on the front wall aligned to direct a second cooling airflow in the first direction;

a first supporting member arranged in the housing; and a first connector on said first supporting member, said first connector comprising a body elongated in a longitudinal direction and second terminals disposed along said longitudinal direction, wherein:

said first connector is adapted to slidably guide said first edge portion of said first electronic unit along said longitudinal direction to a first fully inserted position such that each one of said first terminals faces a respective one of said second terminals;

the first direction of cooling airflow is along the longitudinal direction; and the rear wall and front wall are parallel to each other and perpendicular to the longitudinal direction.

37. The apparatus according to claim 30, wherein said first connector includes a first lock mechanism locking said first edge portion of said first electronic unit at said first fully inserted position and connecting said first terminals and said second terminals electrically.

38. The apparatus according to claim 33, wherein said first connector includes a first lock mechanism locking said first edge portion of said first electronic unit at said first fully inserted position and connecting said first terminals and said second terminals electrically.

39. An apparatus adapted to make an electrical connection with a first electronic unit having a first edge portion and first terminals disposed along said first edge portion, said apparatus comprising:

a first supporting member; and a first connector supported by said first supporting member, said first connector having a body elongated in a longitudinal direction and second terminals disposed along said longitudinal direction, wherein:

said first connector is adapted to slidably guide said first edge portion of said first electronic unit along said longitudinal direction to a first fully inserted position such that each one of said first terminals faces a respective one of said second terminals;

said first connector includes a first lock mechanism locking said first edge portion of said first electronic unit at said first fully inserted position and connecting said first terminals and said second terminals electrically; and a housing having a front portion, a rear portion and a front opening in said front portion, wherein:

said first supporting member and said first connector are arranged between said front portion and said rear portion of said housing;

said longitudinal direction of said first connector is substantially parallel to a direction from said front portion to said rear portion of said housing; and said housing further has a fan providing a cooling airflow in a direction from said front portion to said rear portion of said housing.

\* \* \* \* \*